(12) United States Patent
Taylor

(10) Patent No.: US 7,847,614 B2
(45) Date of Patent: Dec. 7, 2010

(54) SWITCH NOISE REDUCTION DEVICE AND METHOD USING COUNTER

(75) Inventor: John Philip Taylor, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 166 days.

(21) Appl. No.: 11/755,674

(22) Filed: May 30, 2007

(65) Prior Publication Data

US 2008/0297205 A1 Dec. 4, 2008

(51) Int. Cl.
*H03K 17/16* (2006.01)

(52) U.S. Cl. .................. 327/384; 327/385; 327/386; 341/24

(58) Field of Classification Search ......... 327/384–386; 341/24
See application file for complete search history.

(56) References Cited

U.S. PATENT DOCUMENTS

| | | | |
|---|---|---|---|
| 3,989,960 A * | 11/1976 | Kodama | 327/386 |
| 4,185,210 A * | 1/1980 | Zuk | 327/19 |
| 4,348,758 A * | 9/1982 | Sutherland | 370/522 |
| 4,628,521 A * | 12/1986 | Nishimura et al. | 377/24 |
| 4,773,051 A * | 9/1988 | Soltermann | 368/187 |
| 4,853,685 A * | 8/1989 | Vogt | 340/3.1 |
| 4,926,072 A * | 5/1990 | Hyodo | 327/22 |
| 4,956,637 A * | 9/1990 | Vogt | 340/644 |
| 5,027,019 A * | 6/1991 | Shiohara | 327/386 |
| 5,059,834 A * | 10/1991 | Tago et al. | 327/310 |
| 5,296,750 A * | 3/1994 | Bozeman, Jr. | 327/516 |
| 5,315,539 A * | 5/1994 | Hawes | 708/300 |
| 5,500,836 A * | 3/1996 | Jeannet | 368/187 |
| 2006/0076984 A1 | 4/2006 | Lu et al. | |

FOREIGN PATENT DOCUMENTS

DE     10 2005 023511 A1    11/2006

OTHER PUBLICATIONS

Internet Document: Ganssle, Jack, "A Guide to Debouncing", The Ganssle Group (Aug. 2004) available at: http://www.ganssle.com/debouncing.pdf (accessed Nov. 7, 2006) Note the "counting algorithm" proposed in this document (starting on p. 18).

* cited by examiner

*Primary Examiner*—Kenneth B. Wells

(57) ABSTRACT

A switch de-bouncing device includes a majority counter that counts samples generated by a sampler sampling a switch output where a counter value is incremented for each sample indicating a first switch state and decremented for each sample indicating a second switch state of the switch. A controller determines that the switch is in the first switch state when the counter value is above a first state threshold and is in the second switch state when the counter value is below a second state threshold.

15 Claims, 4 Drawing Sheets

SWITCH NOISE REDUCTION DEVICE AND METHOD USING COUNTER

FIELD OF THE INVENTION

This invention generally relates to switches and more particularly to a switch de-bouncing device and method.

BACKGROUND

Electrical switches are limited in that switch outputs are susceptible to false readings due to noise, bounce, or other causes. For example, contacts of mechanical switches may open and close as the contacts bounce after the switch is triggered from one state to another. The resulting switch output may be interpreted as multiple activations of the switch or may otherwise result in undesired readings. Other types of switches, such as capacitive touch switches, do not have mechanical moving contacts that bounce but are still susceptible to inaccurate outputs due to other causes such as noise. Electro-magnetic signals and static electricity, for example, may cause the charge in a capacitive touch switch to discharge more rapidly or more slowly than otherwise and may cause the sensing circuitry to incorrectly interpret the state of the switch. Conventional techniques for dealing with switch bounce and noise, however, are limited in that additional hardware components are required, adding size and expense. Further, fixed timing must be established and the information regarding the switch output must be tracked, increasing complexity and consuming resources. For example, many conventional techniques for addressing switch bounce and noise issues include obtaining multiple samples of the switch output at periodic intervals to verify that the switch output signal was stable and was not the result of a transient. Typically, such a software solution is paired with an external hardware element such as a resistor-capacitor (R/C) filter.

Therefore, there is a need for a switch de-bouncing device and method.

SUMMARY

A switch de-bouncing device includes a majority counter that counts samples generated by a sampler sampling a switch output where a counter value is incremented for each sample indicating a first switch state and decremented for each sample indicating a second switch state of the switch. A controller determines that the switch is in the first switch state when the counter value is above a first state threshold and is in the second switch state when the counter value is below a second state threshold.

DETAILED DESCRIPTION

Figure 1:
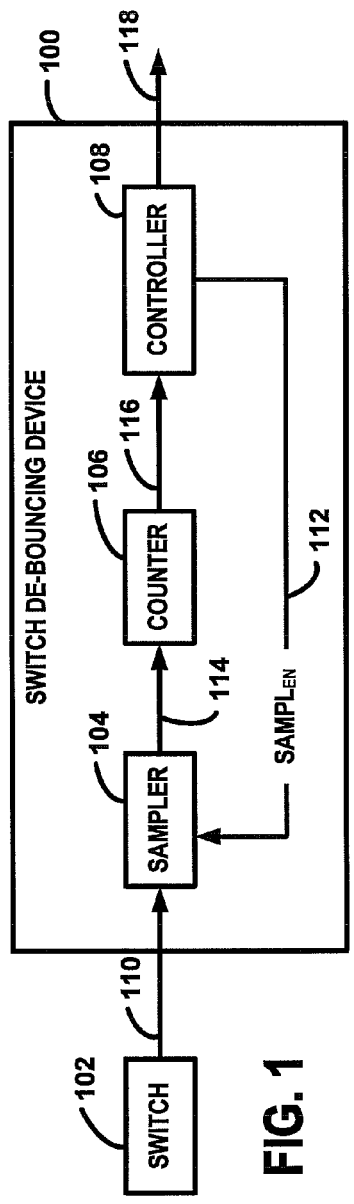
FIG. 1 is a block diagram of switch de-bouncing device in accordance with an exemplary embodiment.

FIG. 1 is a block diagram of a switch de-bouncing device 100 connected to a switch 102. The switch de-bouncing device 100 may be used to filter, process, or otherwise interpret the output of any of numerous switches 102 to reduce or eliminate false readings of the switch output due to noise, bounce, or other causes. The switch 102 may be a mechanical switch or other type of switch, such as a capacitive touch switch. The switch de-bouncing device 100 is designed in accordance with the type and size of switch as well as the anticipated causes for multiple and false readings. For example, the sampling rate for the switch de-bouncing device may be selected based on the frequency of the noise present at a capacitive touch switch. The switch de-bouncing device 100 may be implemented using any combination of hardware, software, and/or firmware to perform the functions described herein as implemented by a sampler 104, a counter 106 and a controller 108. Exemplary implementations of the sampler 104, counter 106 and controller 108 are described below. The functions described as performed in a functional block may be performed by multiple devices or blocks. Further, functions described as performed in one block may be performed by other blocks in some circumstances. For example, the counter 106 may be implemented as part of a controller 108 in some situations.

The sampler 104 samples an output signal 110 received from an output of the switch 102 at a sampling rate determined by a sample enable signal ($SAMPL_{EN}$) 112. The plurality of samples 114 generated by the sampler 104 are received by the counter 106 where each sample indicates the switch is in one of two switch states such as an on state and an off state. The counter 106 is a majority counter that increments a counter value for one of the states and decrements the counter for the other state. For an example discussed below, the counter value is incremented for each sample indicating an on switch state and decremented for each sample indicating an off switch state. In some situations, the counter value can be incremented for an off state sample and decremented for each on state sample. In such implementations, the thresholds and output signals are reversed as compared to the exemplary signals and values discussed herein. The counter value is not decremented below a minimum counter value or incremented above a maximum counter value.

The controller 108 generates an output signal 118 based on a counter value signal 116 received from the counter 106. The controller 108 determines that the switch 102 is in the first switch state when the counter value has exceeded a first state threshold and determines that the switch 102 is in a second switch state when the counter value has declined below a second state threshold. For the example discussed, therefore, the controller 108 generates an output signal 118 indicating the switch is in the on state when the counter value exceeds an upper threshold and generates an output signal 118 indicating the switch 102 is in an off state when the counter value drops below a lower threshold.

Figure 2:
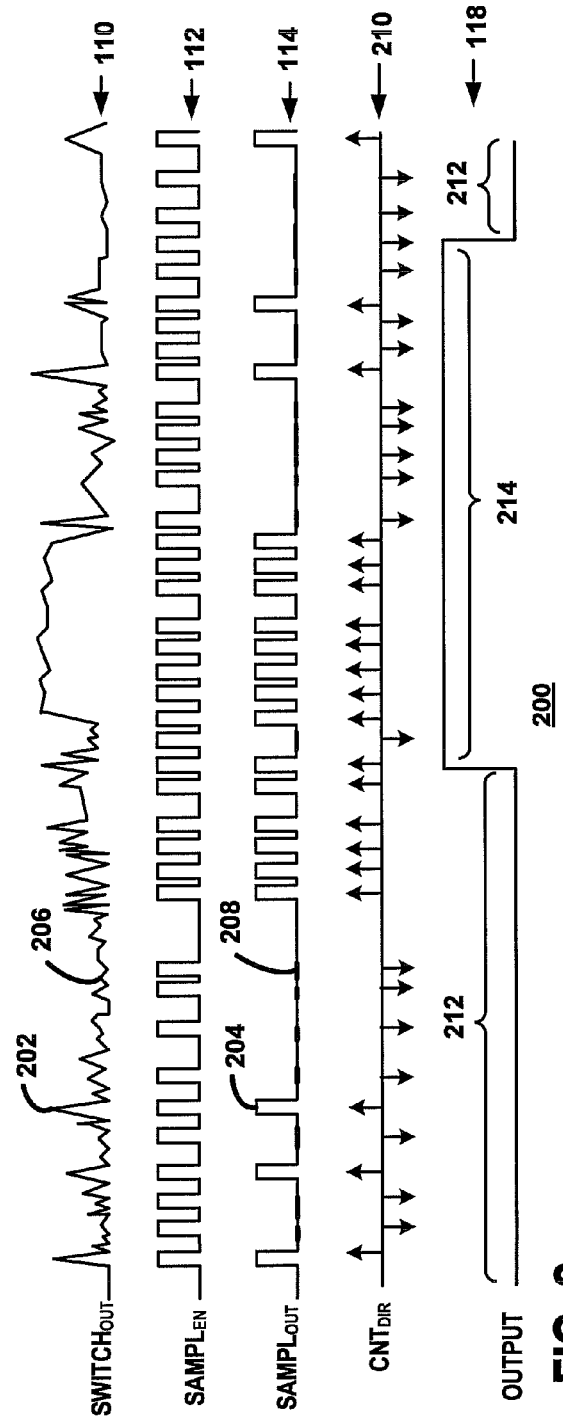
FIG. 2 is a graphical representation of exemplary signals received, processed and generated by the switch de-bouncing device.

FIG. 2 is a graphical representation of exemplary signals received, processed and generated by the switch de-bouncing device 100 where the first switch state is an on state and the second switch state is an off state. The switch output signal ($SWITCH_{OUT}$) 110 may have any combination of noise, bouncing, or other events that alter the intended state of the switch 102. Accordingly, the switch output signals 110 shown in FIG. 2 generally represent outputs of mechanical switch and capacitive touch switches. In the exemplary embodiment, the sampler 104 samples the switch output 110 at sample times indicated by the controller 108 through the sample enable signal (SAMPL$_{EN}$) 112. In some situations, the sampler 104 may sample without control from the controller 108. For example, the sampler 104 may sample the signal at periodic intervals without direction from the controller 108. The resulting sampler output signal 114 includes a plurality of samples where each sample indicates a state of the switch 102. As shown in FIG. 2, high switch output signals 202 interpreted as on states of the switch are represented as positive pulses 204. Low switch output signals 206 interpreted as off states are represented as zero level signals 208. Any of numerous techniques may be used to interpret the switch output 110 to determine a switch state at a sample time. A suitable technique includes generating an on state pulse 204 when the signal amplitude is above a threshold and generating an off state signal when the switch output signal amplitude is below the threshold.

A counter direction state (CNT$_{DIR}$) 210 shows the counter directions corresponding to the plurality of samples of the sampler output signal 114. For each positive pulse of the sampler output signal 114, FIG. 2 shows an upward pointing arrow indicating that the counter value 116 is incremented by one. For each zero sample, the counter direction state shows a downward pointing arrow indicating the counter value 116 is decremented by one. As mentioned above, the directions may be reversed in some implementations. As explained in further detail below with reference to FIG. 3, the output 118 of the switch de-bouncing device 100 remains in an off state with a low level output 212 until the counter value exceeds the upper threshold (first state threshold) and remains in an on state with a high level output 214 until the counter value decreases below a lower threshold (second state threshold). Accordingly, the device 100 output follows a hysteresis function.

Figure 3:
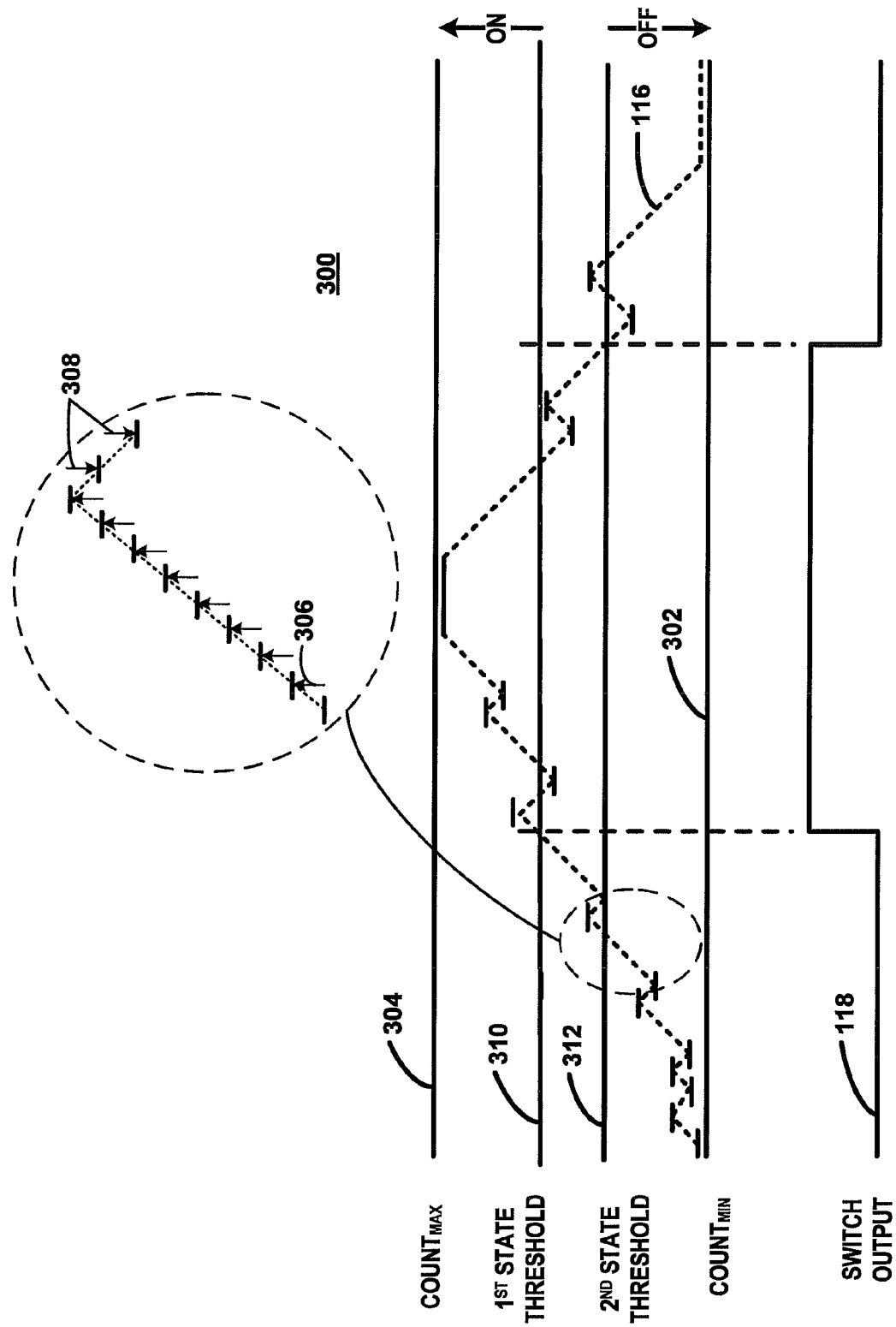
FIG. 3 is a graphical representation of an exemplary counter value signal and a corresponding de-bouncing device output signal.

FIG. 3 is a graphical representation 300 of an exemplary counter value signal 116 and a corresponding de-bouncing device output signal 118. The values depicted in FIG. 3 do not necessarily correspond to the values represented in FIG. 2. As discussed above, the counter value is incremented and decremented based on the samples generated by the sampler 104. The counter value 116 is increased for each sample indicating a first switch state and decremented for each sample indicating a second switch state. In the exemplary embodiment, the counter value 116 is incremented by one increment 306 for each sample indicating the switch is in an on state and decremented by one decrement 308 for each sample indicating the switch is in the off state. The counter value 116 ranges from a minimum counter value (COUNT$_{MIN}$) 302 to a maximum counter value (COUNT$_{MAX}$) 304. Accordingly, the counter value is not decreased below the minimum counter value 302 or increased above the maximum counter value 304. When the counter value exceeds a first state threshold 310, the controller 108 determines that the switch 102 is in the first switch state and generates an output 118 indicating the first switch state. In the exemplary embodiment, the first state threshold 310 is an on state threshold and the controller 108 generates a high level output 214 indicating the switch is on. When the counter value 116 decreased to the second switch state 312, the controller 108 generates an output 118 indicating the switch 102 is in the second switch state. In the exemplary embodiment, the second state threshold 312 is an off state threshold and the controller 108 generates a low level output 212 indicating the switch is off. Therefore, the output signal 118 of the de-bouncing device 100 follows a hysteresis function. Noise, bouncing, and other potential causes of false readings have minimal or no impact on the interpreted switch output. The exemplary de-bouncing device 100 using the majority counter is less likely to generate a false reading than a conventional de-bouncing circuit based on a counter value average since large extraneous signals do not affect the majority counter value as much as an average counter value. Although the de-bouncing device 100 may be used with various types of switches, the exemplary de-bouncing device 100 is especially useful with capacitive touch switches.

Figure 4:
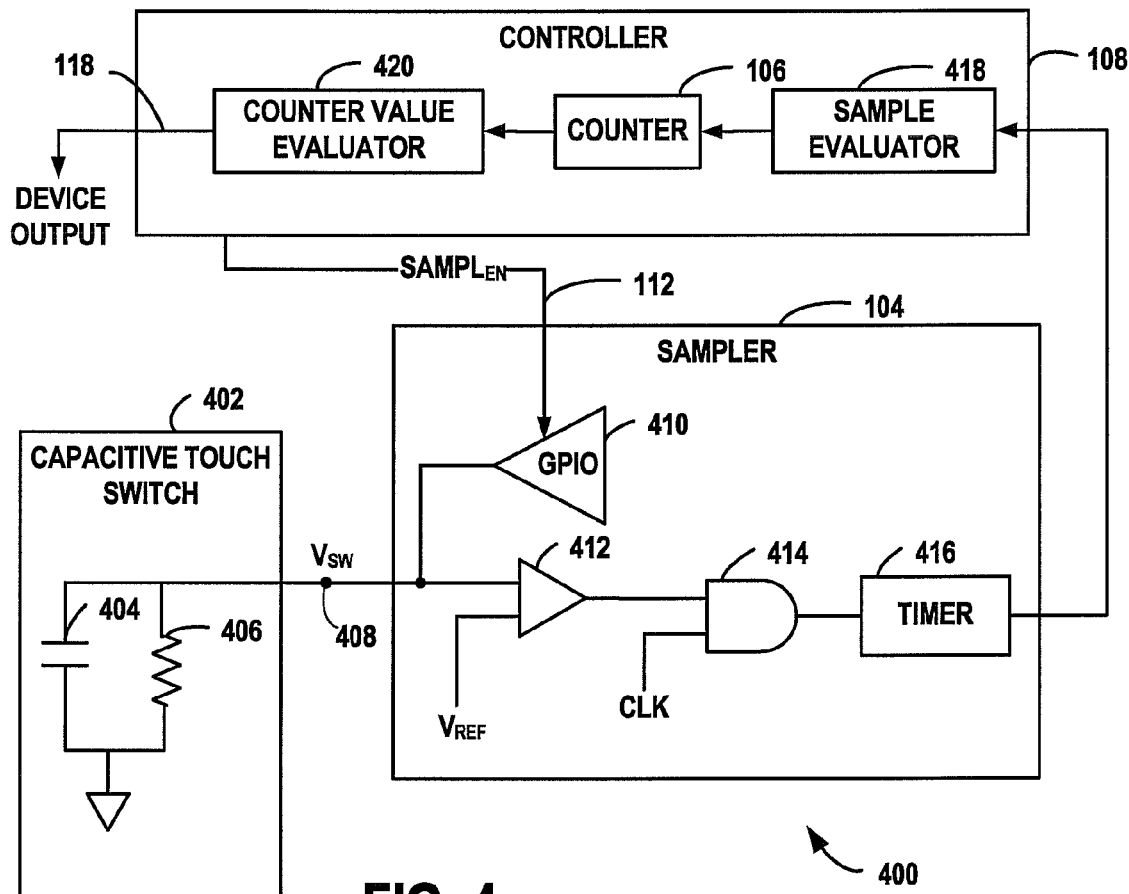
FIG. 4 is a block diagram of a switch system including a switch de-bouncing device connected to a capacitive touch switch where the switch de-bouncing device is a capacitive touch switch de-bouncing device.

FIG. 4 is a block diagram a switch system including a switch de-bouncing device 100 connected to a capacitive touch switch 402 where the switch de-bouncing device 100 is a capacitive touch switch de-bouncing device 400. The capacitive touch switch 402 includes two adjacent conductive areas on an insulating material such as glass or a printed-circuit board to form a capacitor 404. The conductive layers create a capacitance that increases when the areas are bridged such as when a finger is placed over them. The state of the switch 402 is determined by determining the change in capacitance from before and after the areas have been bridged. In the exemplary embodiment, a resistor 406 and the capacitor 404 form an RC circuit having a time constant that is determined by measuring the decay period of a switch voltage (V$_{SW}$) 408 across the RC combination. A general purpose input/output (GPIO) port 410, in response to the sample enable signal (SAMPL$_{EN}$) 112 provided by the controller 108, applies a voltage to the RC circuit then presents a high impedance to the circuit. Therefore, an initial voltage is applied to the switch 402 for a duration sufficient to charge the capacitor 404 before the GPIO port 410 is turned off to present a high impedance to allow the capacitor 404 to discharge through the resistor 406. A comparator 412 generates a logic signal based on the voltage across the switch 402 and a reference voltage. When the switch voltage 408 is greater than the reference voltage, the comparator 412 generates a high logic signal. Otherwise the output signal from the comparator 412 is a low logic signal. A clock signal and the output of the comparator 412 are received at an AND gate 414. As a result the output of the AND gate 414 is a series of clock pulses that begin when the GPIO port 410 is set high until the voltage (V$_{SW}$) 408 across the capacitance 404 decays through the resistance 406 below the reference voltage (V$_{REF}$). A timer 416 is reset at each sample and measures the duration of the decay by the number of clock cycles that elapse. The controller 108 determines if the time period indicates that the switch 402 has been touched. If the time period is longer than a threshold period, the controller 108 determines that the switch 402 is providing an output that indicates that the switch 402 has been touched. If the time period is less than a threshold, the controller 108 determines that the switch output 110 indicates that switch 410 has not been touched. The indications by the switch output 110, however, may not accurately indicate the actual state of the switch 402. Noise may alter the voltage (V$_{SW}$) 408 across the capacitor 404 resulting in a shorter or longer voltage decay period than would have occurred without the noise. In some cases the noise sufficiently alters the voltage (V$_{SW}$) 408 to cause the time period to indicate the opposite state of the switch from the state that would have been indicated without the presence of noise.

In accordance with the exemplary embodiment, the controller 108 monitors the counter value to determine the state of the switch 402. As described above, the counter 106 counts the samples by incrementing and decrementing the counter value based on the states indicated by each sample. Each sample is evaluated to determine the direction of the counter, the counter is incremented or decremented and the counter value is evaluated to determine the appropriate output 118.

A sample evaluator 418 processes the data captured by the timer to determine if each sample represents a first switch state or a second switch state. The sample evaluator 418 determines if the decay time period measured by the timer for a sample is greater than or less than a sample threshold. If the sample decay time period is greater than the sample threshold, the sample evaluator 418 determines the sample represents a first state sample such as on state sample. If the sample period is less than or equal to the sample threshold, the sample evaluator determines the sample indicates a second state sample such as an off state sample. The sample evaluator is implemented as part of the controller 108 in the exemplary embodiment.

Based on the determinations of the sample evaluator 418, the counter 106 is incremented or decremented. A counter value evaluator 420 evaluates the counter value to determine the output 118.

The various components of the switch de-bouncing device 400 may be implemented using any combination of hardware, software and/or firmware. One or more functional blocks discussed with reference to FIG. 4 may be implemented over several devices or within a single device. For example, counter 106, sample, evaluator. Counter evaluator 420 and any number of sampler components may be implemented in a signal processor or application specific integrated circuit (ASIC). An example of suitable implementation includes utilizing a single micro-processor that contains hardware implementations of an oscillator, GRID controller, comparator, gating logic, timer and memory. Firmware code contained in one part of the memory, such as a ROM, controls the various hardware devices to generate samples from the timer that are counted. The count is stored in another part of the memory, such as RAM. The firmware processes and invokes actions based on the resulting count based on pre-determined thresholds or may communicate the result to another external device. Selections of the particular component values and device types are based on the size of the switch and characteristics of the expected noise. An example of a typical capacitive touch switch 402 for use in a portable communication device includes a capacitance on the order of 10 to 200 pF and a resistance of 4.7 MΩ. For such a switch 402, a suitable timer includes a 16 bit timer where the clock frequency is about 8 MHz. Suitable values for the minimum counter value 302 and the maximum counter value 304 are 0 and 31, respectively. A suitable first state threshold (upper threshold) 310 is 25 and a suitable second state threshold (lower threshold) 312 is 6.

Figure 5:
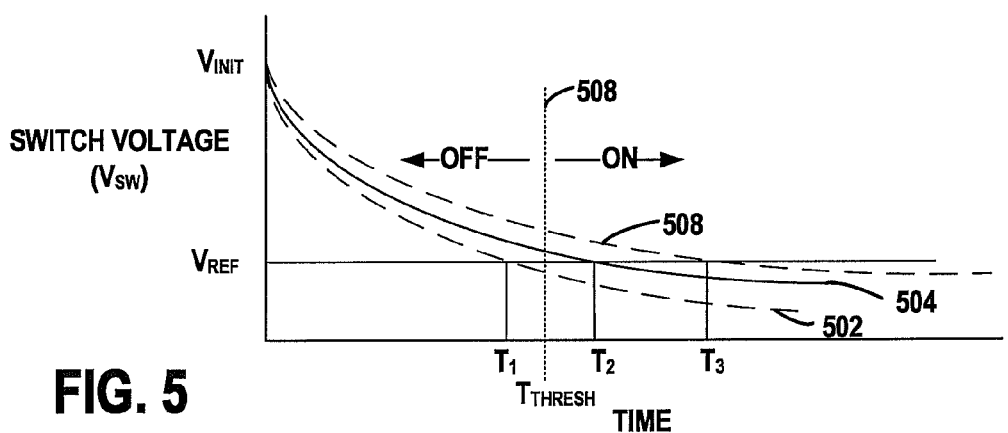
FIG. 5 is a graphical illustration of exemplary relationships of the switch voltage over time for each sample period of the capacitive touch switch.

FIG. 5 is a graphical illustration of exemplary relationships of the switch voltage over time for each sample period of the capacitive touch switch 402. The curves 502, 504, 506 of the switch voltage 408 over time show general relationships between the voltage 408 and time for different situations and are not necessarily to scale. The most quickly decaying curve 502 reaches the reference voltage ($V_{REF}$) within a decay period of $T_1$. The slowest decaying curve 506 reaches the reference voltage ($V_{REF}$) within a decay period of $T_3$. The middle curve 504 reaches the reference voltage ($V_{REF}$) within a decay period of $T_2$ which is between the two other periods. In the exemplary embodiment, the sample evaluator 418 compares the decay period for each sample and determines if it is greater than a sample threshold ($T_{THRESH}$) 508. If the sample period is greater than the sample threshold, the sample evaluator 418 determines that the sample is an on state sample. If the sample period is less than or equal to the sample threshold, the sample evaluator 418 determines that the sample is an off state sample. Accordingly, for the example in FIG. 5, the most quickly decaying curve 502 would be timed by the timer 416 and determined to be an off state sample. The other curves with sample periods of T2 and T3 are determined to be on state samples. As described above, the counter 106 value is incremented and decremented based on the resulting sample states.

Figure 6:
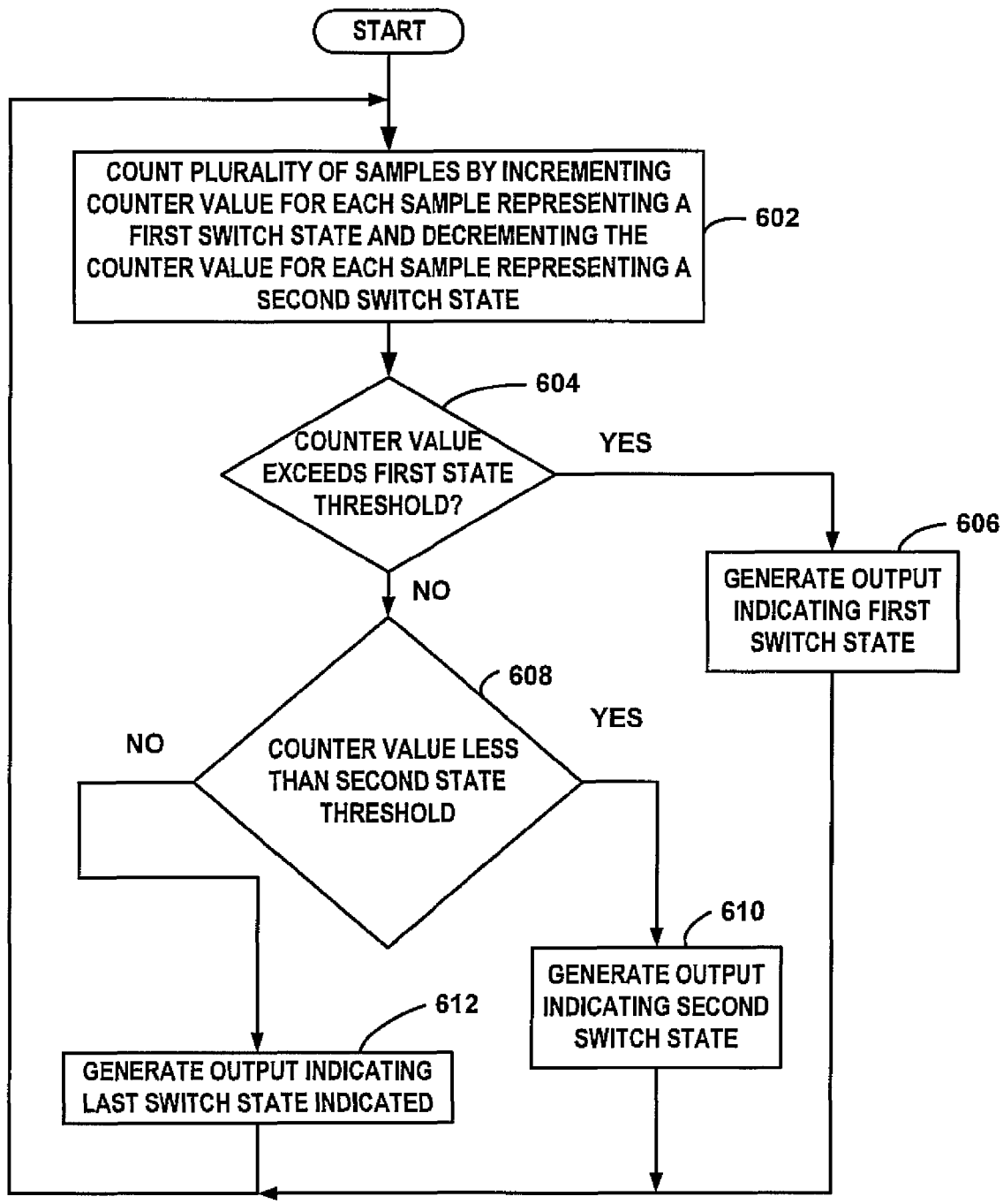
FIG. 6 is a flow chart of a method of de-bouncing a switch in accordance with the exemplary embodiment.

FIG. 6 is a flow chart of a method of de-bouncing a switch in accordance with the exemplary embodiment. Although the method can be executed by any combination of hardware, software and/or firmware, the method is performed by executing software code on the controller 108 in the exemplary embodiment.

At step 602, a plurality of samples are counted by incrementing a counter value 116 for each sample representing a first switch state and decrementing the counter value 116 for each sample representing a second switch state. Samples generated by a sampler are evaluated to determine the state of the switch indicated by each sample. If the sample indicates a first state such as an on state, the counter value 116 is incremented. If the sample indicates a second switch state, such as an off state, the counter value 116 is decremented. The counter value 116 is maintained between a minimum counter value 302 and a maximum counter value 304. Accordingly, the counter value 116 is not incremented if the counter value 116 is equal to the maximum counter value 304 and is not decremented if the counter value 116 is equal to the minimum counter value 302.

At step 604, it is determined whether the counter value 116 exceeds the first state threshold 310. If the counter value 116 is greater than the first state threshold 310, the method continues at step 606. Otherwise, the method proceeds to step 608.

At step 606, a device output signal 118 is generated that indicates the state of the switch 402 is the first switch state. Therefore, if the first switch state is an on state and the counter value 116 is determined to be greater than the on state threshold (first state threshold) in step 604, the switch de-bouncing device 100 generates an output signal 118 indicating the switch 402 has been activated and is in the on state. The output signal 118 is maintained until the method requires a change. Accordingly, the method returns to step 602 to continue counting the samples.

At step 608, it is determined whether the counter value 116 is less than a second state threshold 312. If the value is below the second state threshold 312, the method continues at step 610. Otherwise, the method proceeds to step 212.

At step 610, a device output signal 118 is generated that indicates the state of the switch 402 is the second switch state. Therefore, if the second switch state is an off state and the counter value 116 is determined to be less than the off state threshold (second state threshold 312) in step 608, the switch de-bouncing device 100 generates an output signal 118 indicating the switch 402 has not been activated and is in the off state. The output signal 118 is maintained until the method requires a change. Accordingly, the method returns to step 602 to continue counting the samples.

At step 612, the device output signal 118 is generated that indicates the previous state of the switch 402. The method arrives at step 612 when the counter value 116 is not greater than first state threshold 310 and is not less than the second state threshold 312. Accordingly, the counter value 116 is between the two thresholds 310, 312 at step 612. The output signal is not changed from the immediately previous state indicated and the method returns to step 602 to continue counting samples.

Any of numerous software code steps may be executed to perform the steps described of the exemplary method. An example of code suitable to perform the method is provided immediately below. For the following example, the minimum counter value 302 is equal to 0 and the maximum counter value 304 is equal to 31. The first state threshold is 25 and the second state threshold is 6. The previously described device and method may be applied to any signal susceptible to noise. For the exemplary code below, an AC signal is sampled to determine the polarity for the purpose of generating a line frequency clock source while eliminating false levels that a simple comparator would generate due to noise on the line. "Debouncer" is a variable for counting high (count up) or low (count down) states of the sampled AC signal. "Sine_level_was" is a previous state of the AC signal as determined from the Debouncer count. "Sine_level_is" is the current state of the AC signal as determined from the Debouncer count. "Sine_counter" is a simple count of changes between low and high levels of Sine_level_was and Sine_level_is. The numbers 0, 6, 25 and 31 are set as examples of the minimum, second threshold, first threshold and maximum values of Debouncer, respectively.

Following the execution of the code below, if the sampled AC signal is determined to be high and the Debouncer has not yet reached its maximum value of 31, Debouncer is incremented. If the sampled AC signal is determined to be low and the Debouncer has not yet reached its minimum value of 0, Debouncer is decremented. If Debouncer is less than the second threshold of 6, the AC line is considered to be currently low, i.e. Sine_level_is low (or alternatively 0). If Debouncer is greater than the first threshold of 25, the AC line is considered to be currently high, i.e. Sine_level_is is high (or alternatively 1). If Sine_level_is different than Sine_level_was, i.e. a change of state, the Sine_counter variable is incremented and Sine_level_was is made equal to Sine_level_is in preparation for the next change of state. A modulo-60 counter is implemented for the purpose of converting a 60 Hz line frequency to seconds.

```
unsigned int1 quarter_second(void){
static unsigned int8 debouncer;
static unsigned int1 sine_level_was;
static unsigned int8 sine_counter;
static unsigned int1 sine_level_is;
if (line_clock)
{
//count up if line sensed high
if(debouncer<31)
        debouncer++;
}
else
{
//count down if line sensed low
if (debouncer>0)
    debouncer--;
}
//if less than 1 to 0 hysterisis then its now low, otherwise no change
    if (debouncer<6)
    sine_level_is=0;
    //if greater than 0 to 1 hysterisis then its now high, otherwise no change
    if (debouncer>(31-6))
    sine_level_is=1;
    //if current state is different than old state, then act on change
    if (sine_level_is != sine_level_was)
    {
    sine_level_was=sine_level_is;    //old state is current state
    sine_counter++;
    if (sine_counter==60)
        {
        sine_counter=0;
```

```
        return 1;
        }
    }
}
return 0;
```

Accordingly, the exemplary switch de-bouncing device 100 and method minimizes false readings of a switch 102 by maintaining a count of samples where the counter value 116 is incremented for samples indicating a first switch state and decremented for samples indicating a second switch state where a first state threshold 310 is greater than the second state threshold 312. The two thresholds 310, 312 establish a hysteresis threshold range. Sampling may occur at any frequency which may be considered to be asynchronous to the expected noise source and at a rate such that the count to the upper and lower thresholds occurs faster than the expected response time of the input. Processing resources are efficiently utilized since sampling is not required to be periodic and processing tasks can be executed for sampling when the burden on resources is minimized. No fixed timing must be established between correlated readings and no information about the input beyond the majority counter value needs to be retained from one input sampling to the next. Hysteresis and response may be dynamically programmed by selection of the maximum counter value 304, the first state threshold and the second state threshold. External filtering is not required. Hard logic Schmidt trigger inputs with arbitrary thresholds are not needed to deal with slow edge rate signals.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A switch noise reduction device comprising:
    a counter configured to count, at a constant rate, a plurality of samples of a switch output by incrementing a counter value by a count value for each sample representing a first switch state and decrementing the counter value by the count value for each sample representing a second switch state;
    a controller configured to determine the switch is in the first switch state when the counter value exceeds a first state threshold and to determine the switch is in the second switch state when the counter value is below a second state threshold; and
    a sampler configured to sample, at a sampling frequency different than a noise frequency of noise, the output of the switch to generate the plurality of samples, the sampler comprising a timer configured to determine a voltage decay period for each sample of the plurality of samples, the voltage decay period corresponding to a time required for a switch voltage of a capacitive touch switch to discharge from an initial voltage to a reference voltage.

2. The switch noise reduction device of claim 1, wherein the controller is configured to determine the switch is in a previous switch state when the counter value is less than the first state threshold and above the second state threshold.

3. The switch noise reduction device of claim 2, wherein the first state is an on state and the second state is an off state.

4. The switch noise reduction device of claim 1, wherein the sampler further comprises a general purpose input/output (GPIO) port configured to charge a capacitance of the capacitive touch switch to the initial voltage and to allow a charge of the capacitance to discharge through a resistance in parallel with the capacitance to generate each sample.

5. The switch noise reduction device of claim 1, further comprising a sample evaluator configured to generate an on state sample for each voltage decay period greater than or equal to a sample threshold and to generate an off state sample for each voltage decay period less than the sample threshold.

6. The switch noise reduction device of claim 1, wherein the first state threshold is greater than the second state threshold.

7. A method for reducing susceptibility of noise in a switch, the method comprising:
counting, a constant rate, a plurality of switch samples of a switch output by incrementing a counter value by a count value for each sample representing a first switch state and decrementing the counter value by the count value for each sample representing a second switch state;
determining the switch is in the first switch state when the counter value exceeds a first state threshold and the switch is in the second switch state when the counter value is below a second state threshold; and
measuring a voltage decay period for each sample of the plurality of samples, the voltage decay period corresponding to a time required for a switch voltage of a capacitive touch switch to discharge from an initial voltage to a reference voltage.

8. The method of claim 7, further comprising:
sampling, at a sampling frequency different than a noise frequency of the noise, the output of the switch to generate the plurality of samples.

9. The method of claim 7, further comprising:
determining the switch is in a previous switch state when the counter value is less than the first state threshold and above the second state threshold.

10. The method of claim 9, wherein the first state is an on state and the second state is an off state.

11. The method of claim 7, further comprising:
charging a capacitance of the capacitive touch switch to the initial voltage with a general purpose input/output (GPIO) port; and
allowing a charge of the capacitance to discharge through a resistance in parallel with the capacitance to generate each sample.

12. The method of claim 11, further comprising:
generating an on state sample for each voltage decay period greater than or equal to a sample threshold; and
generating an off state sample for each voltage decay period less than the sample threshold.

13. A switch device comprising:
a sampler configured to sample an output of a capacitive touch switch to generate a plurality of samples, each sample indicating one of two switch states comprising an on state and an off state, the sampler comprising a timer configured to determine a voltage decay period for each sample of the plurality of samples, the voltage decay period corresponding to a time required for a switch voltage of the capacitive touch switch to discharge from an initial voltage to a reference voltage;
a counter configured to count, at a constant rate, the plurality of samples by incrementing a counter value, by a count value, for each sample representing the on state and decrementing the counter value by the count value for each sample representing the off state; and
a controller configured to determine the switch is on when the counter value exceeds an on state threshold and to determine the switch is off when the when the counter value is below an off state threshold, the on state threshold greater than the off state threshold.

14. The switch device of claim 13, wherein the controller is configured to determine the switch is in a previous switch state when the counter value is less than the on state threshold and above the off state threshold.

15. The switch device of claim 13, wherein the sampler is configured to sample the output at a sampling frequency different than a noise frequency.

* * * * *